United States Patent
Michelin

(10) Patent No.: US 7,616,327 B2
(45) Date of Patent: Nov. 10, 2009

(54) OPTICAL MEASURING DEVICE USING OPTICAL TRIANGULATION

(75) Inventor: Jean-Luc Michelin, Bois Colombes (FR)

(73) Assignee: Sagem Défense Sécurité, Paris (FR)

(*) Notice: Subject to any disclaimer, the term of this patent is extended or adjusted under 35 U.S.C. 154(b) by 276 days.

(21) Appl. No.: 11/909,069

(22) PCT Filed: Mar. 17, 2006

(86) PCT No.: PCT/FR2006/000601
§ 371 (c)(1),
(2), (4) Date: Sep. 18, 2007

(87) PCT Pub. No.: WO2006/097645
PCT Pub. Date: Sep. 21, 2006

(65) Prior Publication Data
US 2009/0141290 A1    Jun. 4, 2009

(30) Foreign Application Priority Data
Mar. 18, 2005  (FR) .................................. 05 02729

(51) Int. Cl.
*G01B 11/14* (2006.01)
*G01J 1/00* (2006.01)
(52) U.S. Cl. .................... 356/623; 356/614; 356/121
(58) Field of Classification Search .......... 356/600–640
See application file for complete search history.

(56) References Cited

U.S. PATENT DOCUMENTS

| 4,356,392 | A | | 10/1982 | Wittekoek et al. |
| 4,383,757 | A | * | 5/1983 | Phillips ........................ 355/53 |
| 4,650,983 | A | | 3/1987 | Suwa |
| 4,866,262 | A | | 9/1989 | van der Werf et al. |
| 5,191,200 | A | * | 3/1993 | van der Werf et al. .... 250/201.4 |
| 5,502,311 | A | | 3/1996 | Imai et al. |

(Continued)

FOREIGN PATENT DOCUMENTS

| EP | 0 502 583 A1 | 3/1992 |
| WO | WO-2005/029192 A3 | 3/2005 |

OTHER PUBLICATIONS

International Search Report for PCT/FR2006/000601, dated Sep. 15, 2006.

(Continued)

*Primary Examiner*—Gregory J Toatley, Jr.
*Assistant Examiner*—Jarreas C Underwood
(74) *Attorney, Agent, or Firm*—Marshall, Gerstein & Borun LLP

(57) ABSTRACT

An optical triangulation measuring device includes an emmiter that emits two alternating light beams with different wavelengths along the same path; a beam splitter; an optical separator that directs the alternating split beams towards the surfaces from which they are reflected; an optical combiner that collects the beams and directs them along a path; optronic sensors that receive two light images and to deliver a signal indicating the position of the energy barycenter a time synchronizer for the two alternating beams and the two images on the optronic sensors; and a processor for processing the signals from the optronic sensors in order to supply information relating to the position and inclination of the surface.

9 Claims, 3 Drawing Sheets

U.S. PATENT DOCUMENTS 6,008,906 A * 12/1999 Maris ..................... 356/432
6,124,601 A * 9/2000 Yoshii et al. ........... 250/559.29
6,124,934 A    9/2000 Shahar et al.
6,721,036 B2 * 4/2004 Scheiberlich et al. ......... 355/53

OTHER PUBLICATIONS

Written Opinion of the International Searching Authority for PCT/FR2006/000601, dated Sep. 18, 2007.

* cited by examiner

OPTICAL MEASURING DEVICE USING OPTICAL TRIANGULATION

FIELD OF THE INVENTION

The present invention relates in general to the field of optical distance and/or inclination measurement by optical triangulation (or optical profilometry) and relates more particularly to improvements made to optical measuring devices using optical triangulation for measuring, relative to a plane reference surface and in a direction substantially perpendicular to said reference surface, the distance and the inclination in two directions of a surface to be measured, which locally can be likened to a plan. The distance and the inclination may be constants over time or else they may change.

BACKGROUND OF THE INVENTION

Measuring devices of this type find particularly advantageous application in the field of microphotolithography (fabrication of microcircuits on a substrate of semiconductor material, for example typically silicon, by exposure, by means of light radiation, for example ultraviolet radiation, of a resist deposited on the surface of this substrate so as to detect, at each instant, the distance and/or inclination deviation (parallelism defect) of a portion of said semiconductor substrate relative to the image plane of the objective of the microphotolithography apparatus and to provide in real time the appropriate position corrections to the substrate.

Another very advantageous application of this type of measuring device relates to the three dimensional measurement of any surface having a shape close to a plane: the surface to be measured is moved precisely in a reference plane (horizontal plane) in two perpendicular directions so that the entire surface is scanned, the measuring device detecting the height and the local slope of the surface; by processing the measurements it is possible to reconstruct the surface in its entirety with greater precision than that which standard three dimensional measuring machines can provide.

The measuring devices employed in known microphotolithography apparatuses are based on several techniques, namely optical triangulation or profilometry, collimated beam analysis, interferometry, etc.

The technique of optical triangulation or profilometry seems to be particularly advantageous because of the simplicity of implementation that it allows, both as regards the optical means to be used and as regards the means for processing the signals resulting in the desired information.

The general principle of optical triangulation is simple: an optical projection system projects an image onto the surface to be measured, and the image, reflected or scattered by the surface, is picked up by an optical detection system; if the surface to be measured is moved or if its shape is modified, the image on the surface moves or is distorted; this movement or distortion is perceived by the optical detection system and the image on the focal plane is modified; the measurement, on the focal plane, of the deviation between the theoretical or initial image and the moved or modified image provides, by data processing, the information about the movement or the distortion of the surface to be measured.

Various optical measuring devices using optical triangulation designed to carry out said measurements are known, especially in microphotolithography apparatuses: see for example documents U.S. Pat. No. 4,356,392, U.S. Pat. No. 4,383,757, U.S. Pat. No. 4,650,983, U.S. Pat. No. 4,866,262, U.S. Pat. No. 5,191,200, U.S. Pat. No. 5,502,311 and U.S. Pat. No. 6,721,036.

However, these known devices have various drawbacks from the structural standpoint (for example moving optical parts, such as oscillating mirrors) and/or from the optical standpoint (for example microstructured image formation and detection) which render the measurements insufficiently precise (vibrations induced by the moving parts), while at the same time the means (in particular optical means) employed prove to be too complex and too expensive.

SUMMARY OF THE INVENTION

The object of the invention is therefore to propose an improved technical solution based on optical triangulation, which meets the various requirements of the practice more satisfactorily, especially as regards achieving greater measurement precision and greater reliability, greater simplicity in the arrangement of the device, and finally obtaining a measuring device of improved quality under acceptable manufacturing cost conditions.

For these purposes, according to a first of its aspects, the invention provides an optical measuring device using optical triangulation for measuring, relative to a plane reference surface and in a direction substantially perpendicular to said reference surface, the distance and the inclination in two directions of a surface to be checked, which locally can be likened to a plane, which device, being configured according to the invention, is characterized in that it comprises:

light emitter means suitable for emitting, with a given repetition frequency, an alternating light beam in a first wavelength range and in a second wavelength range;

beam divider means suitable for generating, from each single incident beam, several separate parallel beams, being at least three in number and distributed in a predetermined configuration;

an optical splitter suitable for directing each of the incident light beams in two different directions in relation to the two wavelength ranges respectively, said optical splitter being placed laterally relative to the reference surface and to the surface to be checked, so that the two output beams are directed, along paths of substantially the same length, into respectively the reference surface and the surface to be checked, off which they undergo respective reflections so as thereafter to converge on each other;

an optical beam combiner suitable for collecting the two reflected beams coming from the same incident beam and in directing them alternately along one and the same optical output path;

sensor means for receiving each of said output beams, said sensor means comprising optronic sensors:

which are fewer than or the same in number as that of the holes in the screen, which are placed in a configuration that is correlated with that of the holes in the screen in such a way that each optronic sensor receives alternately two light images (for example in the form of light spots) formed by the two alternate beams reflected by the reference surface and the surface to be measured respectively and which are suitable for delivering an output signal representative of the position of the energy barycenter of each of the two light images;

synchronization means for establishing a temporal relationship between the wavelength range of the beam emitted by the light emitter means and the images formed on the optronic sensors; and means for processing all of the signals delivered by the optronic sensors in order to provide information about the position and inclination of the surface to be measured relative to the reference surface.

In one simple embodiment, which is preferred, each sensor of the sensor means is a photosensitive sensor of the position-sensitive type called a PSD (position sensitive detector) sensor suitable for delivering two output signals representative of the position of the energy barycenter of each of the two light images.

Advantageously, the signal processing means are suitable for supplying information about the best estimate of the distance and the best estimates of the two angles of inclination, respectively, of the surface to be measured relative to the reference surface.

Again in a preferred embodiment of the provisions according to the invention, the light emitter means comprise:

- at least one light source emitting a light beam in a wavelength band encompassing said first and second ranges; and
- an optical modulator suitable for isolating, in said light beam, said first and second wavelength ranges alternately over time in a predetermined frequency cycle.

In practice, especially with a view to application in microphotolithography, the sampling frequency is tied to the bandwidth required for the feedback control of the position of the substrate. This sampling frequency is typically between 1 and 10 kHz and is preferably about 2.5 kHz.

In one possible embodiment, which may be beneficial in particular in the field of microphotolithography employing light (for example ultraviolet) radiation, the light emitter means emit in a wavelength range in the red and/or in the near infrared but does not interfere with the photoresist deposited on the substrate during said process for fabricating electronic microcircuits. In particular, it is then possible for said two wavelength ranges to be the approximately 600-630 nm range in the case of the beam directed onto the reference surface and the approximately 670-1050 nm range in respect of the beam directed onto the surface to be measured, respectively, it being possible for the approximately 630 670 nm intermediate region between these two ranges to be adjusted.

As regards the beam splitter means, various solutions may be envisioned. One simple solution to implement may consist of the fact that said beam splitter means comprise a screen which has at least three holes of predefined shape arranged in a predetermined configuration which is suitable for being illuminated alternately by said light beams.

Again in a preferred embodiment, the optical splitter and the optical combiner are static optical components operating by refraction and reflection according to the wavelengths.

The implementation of the provisions according to the invention, and especially the combined implementation of all of these provisions, provides many useful advantages.

One important advantage lies in the fact that, with the exception of the different paths between the beam splitter and the beam combiner, the two beams follow exactly the same optical path, passing through or being reflected off the same optical components. The relative position of the surface measured relative to the reference surface depends only on the optical path difference between the two beams. Thus, any modification in the characteristics of the optical components and/or of the optical path—especially due to thermal drift, to vibrations, to long term drift such as that due to ageing—has an identical influence on both beams so that relative readjustments are unnecessary.

Another important advantage is that the measurement of the relative position of the surface to be measured with respect to the reference surface is independent of the position of the measurement system relative to said surfaces, thereby making the measuring device insensitive to vibrations and to variations in position of the measuring device.

Another important advantage is based on the fact that all the optical components are entirely static and include no moving part, in particular for producing the optical beam splitter and optical beam combiner: the absence of moving parts avoids vibrations, this being of paramount importance in particular in the more specifically envisioned application to microphotolithography apparatus for which the slightest vibrations are the cause of major troubles in the fabrication of integrated microcircuits.

In addition, the absence of parts undergoing relative movement precludes friction between parts, which is the origin of the formation of dust, for example metal dust, the presence of which may be highly detrimental, in particular, here again, in microphotolithography apparatus operating in a clean atmosphere.

Finally, the use, as explained above, of photosensitive electronic components of the position sensitive (PSD) type, which are suitable for delivering an output signal representative of the position of the energy barycenter of the two light spots formed by the two light beams, in order to constitute the sensors, represents a considerable simplification of the detection part of the device. This is because each sensor is intrinsically designed so as to deliver barycentric information in relation with its double illumination and it is then sufficient for processing means known per se to process all of the signals and to deduce therefrom the desired information (in the form of better estimations of the distance and inclination values) about the position of the surface to be measured with respect to the reference surface.

In total, the implementation of a measuring device designed in accordance with the invention in a microphotolithography apparatus may lead to a considerable improvement in the conditions under which the apparatus is used and may considerably enhance the performance of the apparatus.

BRIEF DESCRIPTION OF THE DRAWINGS

The invention will be more clearly understood on reading the following detailed description of certain preferred embodiments given solely by way of non-limiting examples. In this description, reference is made to the appended drawings in which.

The general provisions of the invention will now be explained with reference to FIGS. 1 and 2.

DETAILED DESCRIPTION OF THE INVENTION

Figure 1:
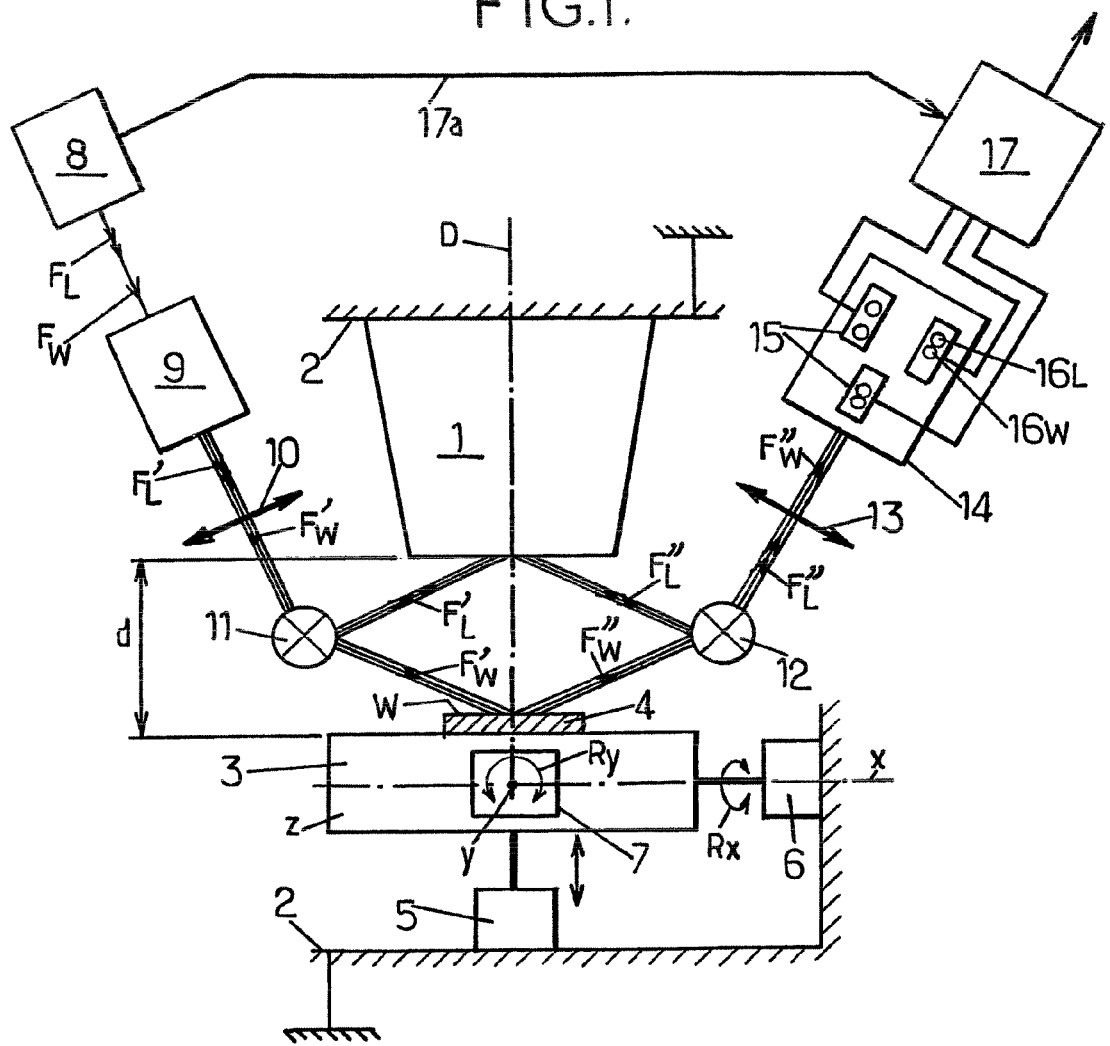
FIG. 1 is a highly schematic view of a measuring device using optical triangulation shown within the context of the application, more specifically intended by the invention, to a microphotolithography apparatus.
Figure 2:
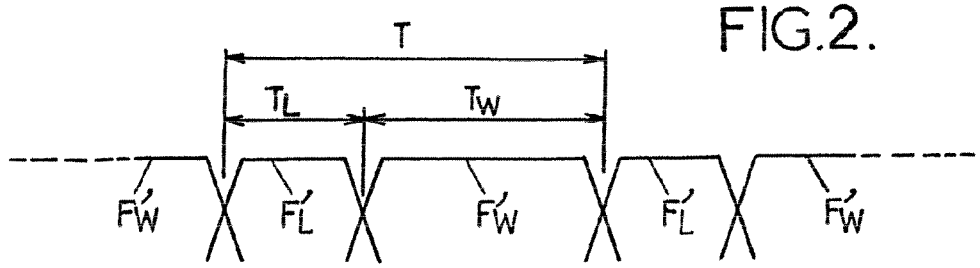
FIG. 2 is a graph explaining the temporal separation of the two beams directed onto the reference surface and onto the surface to be checked, respectively, in the device of FIG. 1.

Shown highly schematically in FIG. 1 is an optical measuring device using optical triangulation or profilometry for measuring, with respect to a plane reference surface L and along a direction D substantially perpendicular to the latter, the distance d and the inclination $R_x$ and $R_y$ in two directions x and y of a surface W to be checked, which locally can be likened to a plane. In other words, the measuring device is capable of measuring the attitude of the surface W with respect to the reference surface L, the two directions x and y defining the surface W to be checked and the direction D corresponding approximately to the direction z perpendicular to the directions x and y.

In FIG. 1, the device is schematically shown within the context of the application more especially envisioned for the practical implementation of the invention, namely a microphotolithography apparatus possessing an objective 1, the optical axis of which is said direction D, which objective is fastened to a frame 2 of the apparatus, and the front face of the terminal lens of which objective is plane and constitutes said reference surface L. Lying opposite the objective 1 is a support 3 which is designed to support an element 4 beneath the objective 1, approximately along the axis of the direction D. In this context, the element 4 is a wafer of a semiconductor material, such as silicon, which is subjected to successive treatments—selective masking and exposure—for the fabrication of integrated microcircuits with a high integration density. It is the upper face of the element 4, turned toward the objective 1, which constitutes said at least locally substantially plane surface W that is to be checked. The support 3 is mounted on the frame 2 of the apparatus via adjustment means for adjusting its position, and therefore that of the wafer 4 that it supports, according to the deviations detected by the measuring device. For this purpose, provision is made for the support 3 to be subjected to the action of three adjustment means, namely a distance adjustment means 5 for operating along the direction D in order to adjust said distance d, and two rotation adjustment means, 6 and 7 respectively, suitable for making the support undergo a rotation Rx about the x axis and a rotation Ry about the y axis, respectively.

The measuring device includes light emitter means 8 suitable for emitting, along the same path, with a given repetition frequency, two alternate light beams in a first wavelength range and in a second wavelength range respectively. In FIG. 1, the two beams are depicted merged: a beam $F_l$ is depicted by a double arrow while the other beam $F_w$ is depicted by a single arrow. Within the context of said specific application, the light emitter means 8 emit in the red and/or in the near infrared: the beam $F_L$ comprises radiation in an approximately 600-630 nm wavelength range $\Delta\lambda_L$ and the beam $F_W$ comprises radiation in an approximately 670-1050 nm wavelength range $\Delta\lambda_W$. The two beams have unequal durations $T_W$ and $T_L$, as shown in FIG. 2, with a sampling cycle time T that is tied to the bandwidth required for the feedback control of the position of the element 4; the sampling frequency is typically between 1 and 10 kHz. Within the context of the application to microphotolithography, the beam $F_L$ has a duration TL of the order of 100 microseconds, whereas the beam $F_W$ has a duration Tw of the order of 300 µs; the total duration T of the cycle is about 400 µs, i.e. a sampling frequency of the order of 2.5 kHz.

Downstream of the light emitter means 8 are beam divider means 9 suitable for generating, from each single incident beam $F_L$, $F_W$, a multiple light beam $F'_L$, $F'_W$ comprising at least three beams distributed in a predetermined configuration.

After an optical projection system 10, the multiple light beams reach an optical splitter 11 suitable for directing the incident light beams $F'_L$, $F'_W$ in two different directions in relation to the two wavelength ranges respectively, said optical splitter 11 being placed laterally with respect to the reference surface and to the surface to be checked, so that the two output beams $F'_L$, $F'_W$ are directed, along paths of substantially the same length, onto the reference surface L and the surface W to be checked, respectively.

The beams $F'_L$ and $F'_W$ undergo respective reflections off the two surfaces L and W so as thereafter to converge on each other on an optical beam combiner 12 suitable for collecting the two reflected beams $F''_L$, $F''_W$ and for directing them alternately along the same optical output path.

After having passed through an optical detection system 13, the alternate outward beams $F'_L$, $F'_W$ reach sensor means 14 comprising optronic sensors 15:

which are fewer than or the same in number as that of the multiple divided beams;

which are placed in a configuration that is correlated with that of the multiple divided beams in such a way that each optronic sensor 15 receives alternately two light images $16_L$, $16_W$ formed by the two alternate reflected beams $F''_L$ $F''_W$ respectively; and which are suitable for delivering an output signal representative of the position of the energy barycenter of each of the two light images $16_L$, $16_W$.

Means 17 are then provided for processing all the signals delivered by the optronic sensors 15 for the final need to provide output information about the position and the inclination of the surface W to be checked with respect to the reference surface L. This output information is then used to control, if this be necessary, said distance adjustment means 5 and rotation adjustment means 6, 7 for adjusting the support 3 so as to bring the element 4 into the correct position with respect to the reference surface L.

In order for the processing means 17 to be capable of discriminating between the two light images $16_L$, $16_W$ formed alternately on the optronic sensors 15, synchronizing means are provided between the light emitter means 8 and, for example, the processing means 17 in order to establish a relationship between the two beams $F_L$, $F_W$ emitted by the light emitter means 8 alternately and the two images $16_L$, $16_W$ formed alternately on the optronic sensors 15. In practice, these synchronizing means may be integrated into the processing means 17, and a link 17a may be provided for this purpose between the light emitter means 8 and the processing means 17.

The sensor means 14 may be designed in any appropriate manner for delivering the desired barycentric energy information. In particular, it is conceivable to use matrices of CCD diodes or of CMOS transistors. However, it seems that, in the current state of the art, the most appropriate solution is one in which each sensor 15 of the sensor means 14 is a photosensitive sensor of the PSD (Position Sensitive Detector) type suitable for delivering two output signals representative of the position of the energy barycenter of each of the two light images $16_L$, $16_W$ received by the sensor. The advantage of this type of sensor lies in its associated electronic circuit, which is small and compact and in its very high precision (better than 1 µm over a length of several millimeters).

Figure 3A:
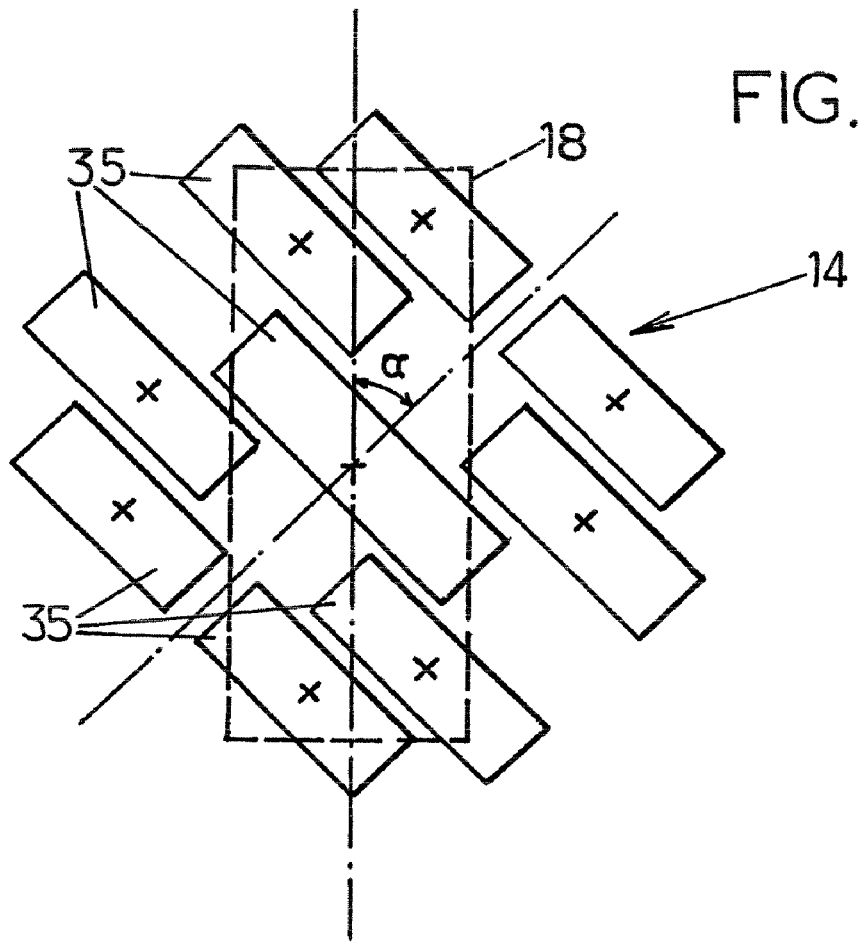
FIG. 3A is a schematic representation of one possible example of the distribution of light spots on the surface to be measured.

The number of sensors to be employed depends on the desired measurement precision, on the size of the area covered by the multiple beams on the surface W to be checked and most particularly on the limits imposed by the optics as regards the number of beams that can be transmitted. FIG. 3A shows by the dashed lines an example of the outline of the image 18 representing the field covered by the light beams F'$_W$ on the surface W, corresponding to that portion of a surface W on which it is desired to estimate the attitude (one distance and two angles). To be specific, this field may be of rectangular shape, with a length of around 20 to 30 mm and a width of 6 to 12 mm. In the example illustrated in FIG. 3A, nine substantially rectangular spots 35 have been shown, these being distributed approximately symmetrically about a central spot within or close to the image field 18 (this implies the use of nine parallel beams resulting from the division of the source beam). The light spots may be of any shape and positioned in any arrangement suitable for providing the best detection efficiency. For example, the rectangular spots 35 are oriented at an angle α of about 45° to the axes of the field.

Figure 3B:
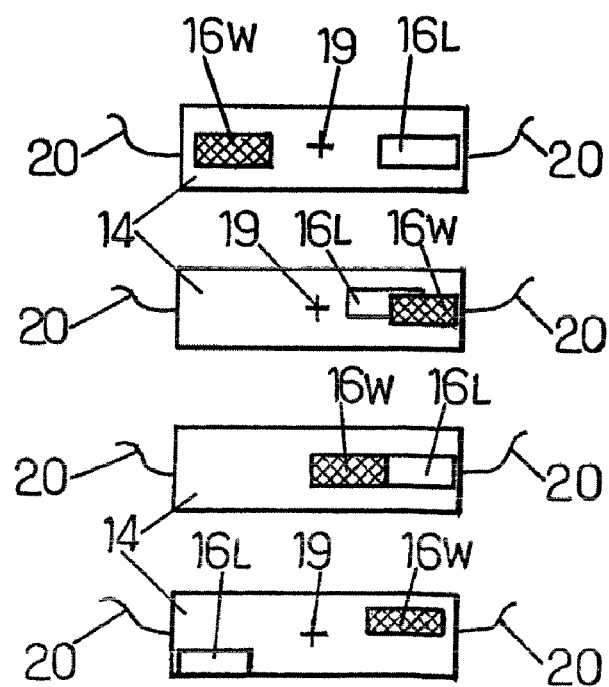
FIG. 3B is a schematic representation illustrating the operation of a preferred example of sensors that can be used in the arrangement shown in FIG. 3A.

FIG. 3B shows on an enlarged scale, again by way of example, a group of four sensors 15 on which the respective centers (the crosses 19) and the light spots of substantially rectangular outline 16$_L$ (blank spot) and 16$_W$ (cross hatched spot) respectively are indicated. The references 20 depict the two connections connecting the two outputs of each sensor 15 to the processing means 17. As indicated above, the output signals of the sensors 15 are representative of the position of the light energy barycenter of the two spots 16$_L$, 16$_W$ with respect to the center 19 serving as positioning reference. Any movement Δh of the surface W with respect to the surface L, whether this movement is due to a shift perpendicular to the two surfaces along the z direction or to an inclination, is reflected in a movement of a spot 16$_W$ on at least one sensor 15.

It should be emphasized that, apart from the very great precision in position detection permitted by this type of sensor, an additional advantage lies in the fact that, owing to the barycentric detection, the shape of the spots and the exact position of the spots 16$_L$ and 16$_W$ are not taken into account. Only the relative distance between the two barycenters of the two spots 16$_L$ and 16$_W$ is taken into account. In particular, it is unnecessary to carry out a very precise initial adjustment of the spots 16$_L$ provided by the reference surface—it is sufficient for these spots to be positioned on the corresponding sensor. However, it is preferred to position them close to the center of the sensor, which corresponds to the optimum intrinsic performance of the sensor.

The means 17 for processing the signals provided by the sensors 15 are designed, in a manner known to those skilled in the art, to perform a calculation algorithm, in particular a matrix calculation, and they provide information about the best estimation of the distance d and best estimations of the two angles of inclination, respectively, of the surface W to be checked with respect to the reference surface L.

Figure 4:
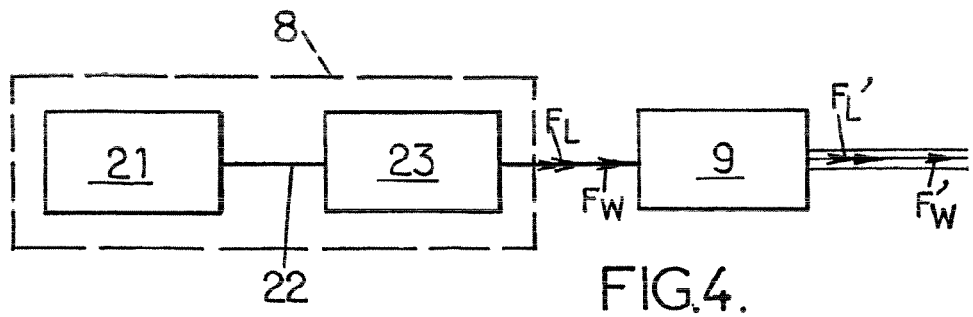
FIG. 4 is a schematic representation of a preferred embodiment of the light emitter means of the device of FIG. 1.

The light emitter means 8 may comprise, as shown in FIG. 4:

a light source (or several combined sources) 21 emitting a single light beam 22 in a wavelength band encompassing the abovementioned first and second ranges Δλ$_L$ and Δλ$_W$; and an optical modulator 23 suitable for isolating, in said single light beam 22, beams having wavelengths corresponding to the abovementioned first and second wavelength ranges Δλ$_L$ and Δλ$_W$ especially, within the abovementioned example envisioned, the approximately 600-630 nm range Δλ$_L$ in the case of the beam directed onto the reference surface and the approximately 670 1050 nm range Δλ$_W$ in the case of the beam directed onto the surface to be checked, and to do so alternately over time with a predetermined frequency cycle, especially with a cycle frequency between 1 and 10 kHz, preferably about 2.5 kHz, within the context of said example.

Figure 5A:
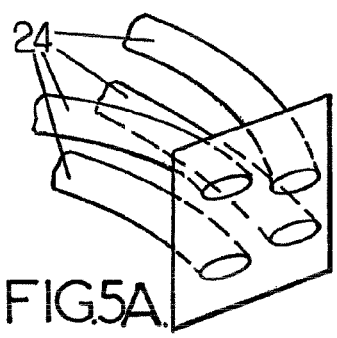
FIGS. 5A and 5B are two exemplary embodiments, shown in simplified form, of the beam splitter means of the device of FIG. 1.
Figure 5B:
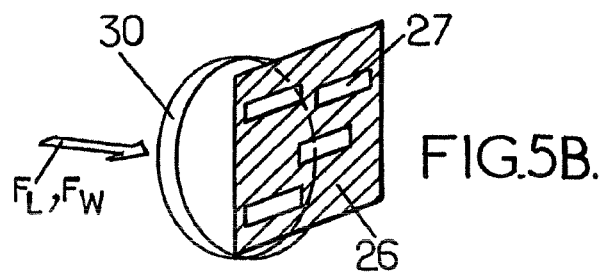

As regards the beam divider means 9, several solutions may be envisioned. It is conceivable, as illustrated in FIG. 5A, for the multiple beams to come from multiple sources in the form of optical fibers 24 supported by a support 25 in an appropriate geometrical configuration so as to form the desired array of light spots. As illustrated in FIG. 5B, the beam divider means constitute, in a simple and currently preferred manner, a plate 26 thus forming a screen, which is illuminated by the beams F$_L$ and F$_W$ through an illumination optic 30, this plate being perforated by several holes 27 of chosen shape and distributed in the required geometrical configuration for obtaining the desired pattern of light spots.

Figure 6A:
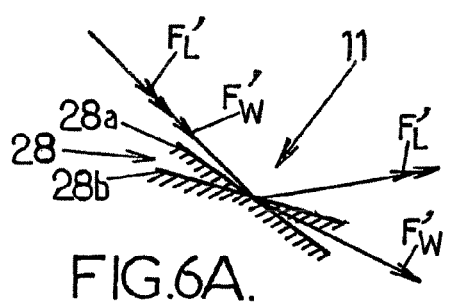
FIGS. 6A to 6C are respective exemplary embodiments of the beam splitter of the device of FIG. 1.
Figure 6B:
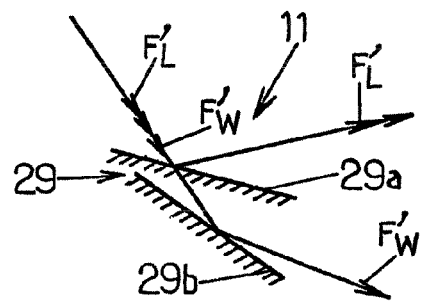
Figure 6C:
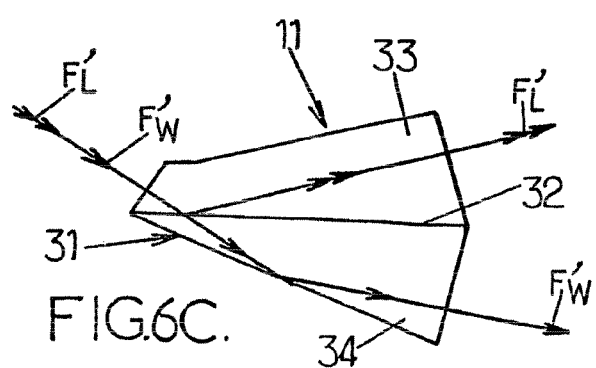

Finally, the optical splitter 11 and the optical combiner 12 are static optical components operating by refraction and reflection according to the wavelength ranges Δλ$_L$ and Δλ$_W$. Technical solutions involving mirrors may be envisioned: a bi mirror 28 employing two juxtaposed mirrors 28a, 28b having different angles of inclination, as shown in FIG. 6A; or else a double mirror 29 using two successive mirrors, as shown in FIG. 6B, the first mirror 29a being for example reflective for the light of the range Δλ$_L$ and refractive for the light of the range Δλ$_W$, whereas the second mirror, placed behind the first, receives the light of the range Δλ$_W$ for which it is reflective. However, the current preferred solution consists in producing both the optical splitter 11 and the optical combiner 12 in the form of a prismatic assembly 31 formed from two plates 33, 34 cemented together, the interface 32 of which is, for example, reflective for light of the range Δλ$_L$ and refractive for the light of the other range, Δλ$_W$, as shown in FIG. 6C.

The invention claimed is:

1. An optical measuring device using optical triangulation for measuring, relative to a plane reference surface (L) and in a direction substantially perpendicular to said reference surface, the distance (d) and the inclination in two directions of a surface (W) to be checked, which locally can be likened to a plane, and comprising:

light emitter means (8) suitable for emitting along the same path, with a given repetition frequency, two alternating light beams (F$_L$, F$_W$) in a first wavelength range (Δλ$_L$) and in a second wavelength range (Δλ$_W$), respectively;

beam divider means (9) suitable for generating, from each single incident beam (F$_L$, F$_W$), several separate parallel light beams (F'$_L$, F'$_W$), being at least three in number and distributed in a predetermined configuration;

an optical splitter (11) suitable for directing each of the incident light beams (F'$_L$, F'$_W$) in two different directions in relation to the two wavelength ranges (Δλ$_L$, Δλ$_W$) respectively, said optical splitter (11) being placed laterally relative to the reference surface (L) and to the surface (W) to be checked, so that the two output beams (F'$_L$, F'$_W$) are directed, along paths of substantially the same length, into respectively the reference surface (L) and the surface (W) to be checked, off which they undergo respective reflections (F"$_L$, F"$_W$) so as thereafter to converge on each other;

an optical beam combiner (12) suitable for collecting the two reflected beams (F"$_L$, F"$_W$) coming from the same incident beam and in directing them alternately along one and the same optical output path;

sensor means (14) for receiving each of said alternating output beams (F"$_L$, F"$_W$), said sensor means (14) comprising optronic sensors (15):

which are fewer than or the same in number as that of the multiple light beams, which are placed in a configuration that is correlated with that of the multiple light beams in such a way that each optronic sensor (15) receives alternately two light images ($16_L$, $16_W$) formed by the two alternate reflected beams ($F'_L$, $F'_W$) respectively and which are suitable for delivering (at 20) an output signal representative of the position of the energy barycenter of each of the two light images ($16_L$, $16_W$);

synchronization means (17, 18) for establishing a temporal relationship between the two alternate beams ($F_L$, $F_W$) emitted by the light emitter means (8) and the two images ($16_L$, $16_W$) respectively formed on the optronic sensors (15); and means (17) for processing all of the signals delivered by the optronic sensors (15) in order to provide information about the position and inclination of the surface (W) to be checked relative to the reference surface (L).

2. The device as claimed in claim 1, wherein each sensor of the sensor means is a photosensitive sensor of the position-sensitive (PSD) type suitable for delivering two output signals representative of the position of the energy barycenter of each of the two light images received by the sensor.

3. The device as claimed in claim 1 wherein the signal processing means are suitable for supplying information about the best estimate of the distance and the best estimates of the two angles of inclination, respectively, of the surface to be checked relative to the reference surface.

4. The device as claimed in claim 1 wherein the light emitter means comprise:

at least one light source emitting a single light beam in a wavelength band encompassing said first and second ranges; and an optical modulator suitable for isolating, in said single light beam, said first and second wavelength ranges alternately over time in a predetermined frequency cycle.

5. The device as claimed in claim 4, wherein the frequency of the cycle is between 1 and 10 kHz and preferably about 2.5 kHz.

6. The device as claimed in claim 1, wherein the light emitter means emit in the red and/or in the near infrared.

7. The device as claimed in claim 6, wherein said two wavelength ranges are the approximately 600-630 nm range in the case of the beam directed onto the reference surface and the approximately 670-1050 nm range in respect of the beam directed onto the surface to be checked, respectively.

8. The device as claimed in claim 1, wherein the beam splitter means comprise a screen which has at least three holes of predefined shape arranged in a predetermined configuration which is suitable for being illuminated alternately by said light beams.

9. The device as claimed in claim 1 wherein the optical splitter and the optical combiner are static optical components operating by refraction and reflection according to the wavelengths.

* * * * *